United States Patent [19]
Gheen et al.

[11] Patent Number: 5,610,754
[45] Date of Patent: Mar. 11, 1997

[54] METHOD AND APPARATUS FOR PHOTOLITHOGRAPHY BY ROTATIONAL SCANNING

[76] Inventors: Gregory Gheen; Alice Gheen; Zhijiang Wang, all of 774 Iroquois Way, Fremont, Calif. 94539

[21] Appl. No.: 287,903

[22] Filed: Aug. 9, 1994

[51] Int. Cl.$^6$ .................................. G02B 26/08
[52] U.S. Cl. .......................... 359/210; 359/823
[58] Field of Search .................. 359/209–211, 205, 359/821–826, 385–391, 212–215, 223, 226; 250/201.2–201.4; 430/5, 302; 378/34–35, 146–148

[56] References Cited

U.S. PATENT DOCUMENTS

| | | | |
|---|---|---|---|
| 4,163,600 | 8/1979 | Russell | 358/199 |
| 4,611,881 | 9/1986 | Schmidt | 359/220 |
| 4,844,568 | 7/1989 | Suzuki et al. | 359/210 |
| 5,159,483 | 10/1992 | Watanabe et al. | 359/210 |
| 5,216,247 | 6/1993 | Wang | 250/236 |

OTHER PUBLICATIONS

PS, "Array lens technology targets FPD manufacturing", Apr., 1994, Semiconductor International, p. 15.
David Holbrook, "Microlithgraphy for large area flat panel display substrates", Solid state technology, May 1992, p. 166–172.

*Primary Examiner*—James Phan

[57] ABSTRACT

A photolithography method copies a pattern plane onto a working plane by a rotating imaging system. The pattern plane is parallel to the working plane. At a given instance, the imaging system images a small region of the pattern plane to the working plane. The imaging system rotates around a fixed axis perpendicular to the pattern plane and on each pass copies a circular arc shaped region from the pattern plane to the working plane. Synchronized translation of the pattern plane and working plane in conjunction with rotation of the imaging system allows the entire pattern plane to be copied to the working plane. The photolithography method can achieve high resolution over a large field-of-view with high write speed and can include an autofocus system to account for variation in the flatness of the working plane. This photolithography method can be used in the visible, UV, IR or x-ray wavebands.

17 Claims, 15 Drawing Sheets

METHOD AND APPARATUS FOR PHOTOLITHOGRAPHY BY ROTATIONAL SCANNING

FIELD OF THE INVENTION

The subject invention relates to an optical scanning method, specifically to a high resolution, large field-of-view photolithography system for manufacturing integrated circuits and flat panel displays.

BACKGROUND OF THE INVENTION

Photolithography has important applications in many areas, including: the printing of graphic-arts, the production of integrated electronic circuits, and the production of flat panel displays, especially active matrix liquid crystal displays (AMLCD).

An ongoing trend in manufacturing integrated electronic circuits is the decrease in structural dimensions and the increase in circuit size and complexity. Current integrated circuit technology offers line widths of less than 1 µm with more than a million transistors squeezed into a single "chip". In laboratories, devices with structure sizes less than 0.5 µm have been realized. In the 1990s, structure sizes smaller than 0.5 µm will be needed, e.g., for the production of 16 Mbit memory chips.

The decrease in the structural dimension of electronic circuits together with the increase in circuit size poses a fundamental problem for current photolithography systems. Similar problems exist for the photolithography systems used to produce high resolution, flat panel displays. It is extremely difficult to simultaneously achieve high resolution and large field-of-view with a lens system. A high resolution lens implies a small depth of focus. This small depth of focus in turn limits the field-of-view in two ways. First, it is difficult and expensive to design a lens with a large flat image plane. Second, and more important, a small depth of focus places tight tolerances on the flatness of the substrate. Producing substrates with small variation over a large field-of view is difficult and expensive. In addition, optical imaging systems with high resolution and large fields-of-view can introduce serious field curvature at the periphery of the image. This makes the overlay of successive exposures problematic since successive exposures are typically performed on different photolithography systems with different degrees of field curvature.

The trade-off between resolution and field-of-view can be improved by using shorter wavelengths of light. However, the optical material available for the deep UV and soft x-ray regions are limited and the associated optical design difficult.

In order to overcome the fundamental limits between resolution and field-of-view, some form of mechanical scanning is necessary. Optical scanning by X-Y translation can achieve high resolution and large fields-of-view; however, this approach can only achieve low data rates because of the low speeds of the translation stage.

Optical steppers are widely used for optical lithography. However, a stepper uses a start-stop action which is inherently slow due to stepping and settling time. In addition, using a stepper to generate a larger pattern requires alignment of adjacent exposures. This requires a careful alignment to stitch together adjacent subpatterns. This stitching process is a source of error (i.e. stitching error) which reduces the effective throughput of the system.

A lithographic system based upon a lens array was recently proposed for the production of flat panel displays. This system uses a two-dimensional lenslet array to image a photomask onto a substrate. Although this approach can achieve a large field of view, it can not achieve high resolution. The lenslet array is a solid unit and cannot account for variations in the flatness of the glass substrate used to produce panel displays. As a result, focus error will limit the resolution of this approach.

In U.S. Pat. No. 4,163,600, issued Aug. 7, 1979 to Russell, U.S. Pat. No. 4,611,881, issued Sept. 16, 1986 to Schmidt et al., and U.S. Pat. No. 5,216,247 issued Jan. 19, 1993 to Wang, et.al., a set of optical scanning techniques were described which use a rotating optical system to scan a point of light across a substrate along a circular arc. These scanning techniques could be used to achieve a direct write photolithography system which provides high resolution, large field-of-view, and relatively high data rates. In addition, this approach can use an autofocus mechanism to account for variations in the substrate flatness. However, to achieve high data rates, the rotating optical system must be spun at very high speeds. The rotation rate can be reduced while maintaining the same writing data rate by simultaneously scanning multiple points; however, this leads to a more complex and expensive system. Furthermore, even with multiple sources, the rotation rate of the optical system is still high enough to pose serious technical challenges due to the high centrifugal force and aero-optic effects.

OBJECT AND ADVANTAGES OF THE INVENTION

Accordingly, several objects and advantages of our invention are:

(a) to provide a high resolution, large field-of-view photolithography system, especially for the manufacture of integrated circuits and flat panel displays;

(b) to provide high throughput by continuous, non-stop rotational scanning;

(c) to provide high throughput at modest rotation speed of the optical system by scanning a small image patch instead of a point or several points;

(d) to provide an autofocus system which can account for variations in the flatness of the substrate and optical mask;

(e) to provide a range of different magnifications between the pattern plane and the working plane; and (f) to provide operation over a variety of wavelengths including extra ultra-violet and x-ray wavelengths where a resolution of better than 0.2 µm is possible.

BRIEF DESCRIPTION OF THE FIGURES

FIG. 3 shows image orientation relative to motion from rotation and translation.

GENERAL DESCRIPTION OF THE INVENTION

Figure 1:
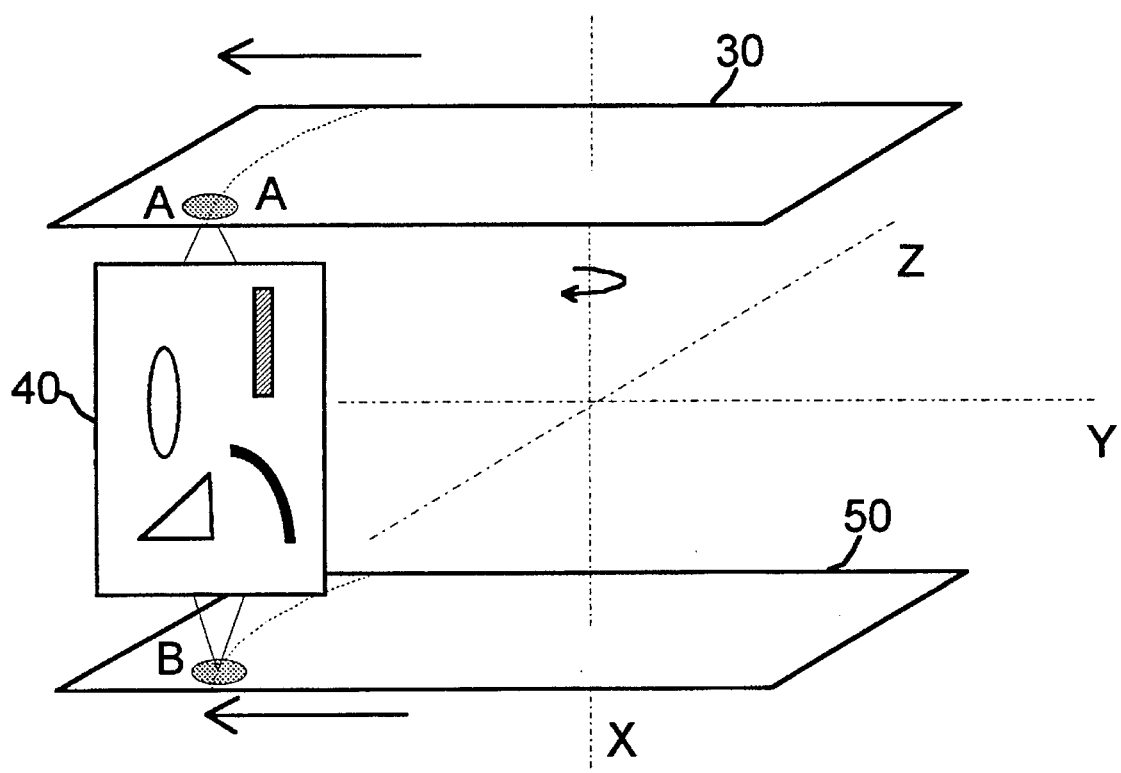
FIG. 1 :shows a block diagram of one realization of the proposed photolithography method.

FIG. 1 illustrates the general operating principle of our photolithography method. The photolithography system essentially comprises a pattern plane 30 (e.g. an photomask), a rotating imaging system 40, and a working plane 50 (e.g., a recording medium). In FIG. 1, the pattern plane 30 and working plane 50 are parallel to the Y-Z plane and the imaging system 40 rotates around the X axis. The imaging system 40 is shown imaging a subregion A in pattern plane 30 onto a subregion B in working plane 50. As the optical system rotates around the X axis, different subregions along a circular arc in pattern plane 30 are imaged onto different subregion along a circular arc in working plane 50. Rotating the optical system scans the image along a circular arc. This allows a circular arc shaped region to be copied from pattern plane 30 to working plane 50. The pattern plane 30 and working plane 50 are translated in the directions indicated. Their translations are synchronized with each other and with the rotation of the imaging system. The entire image is copied from pattern plane 30 to working plane 50 by rotating the optical system while simultaneously translating the pattern plane and working plane. The pattern plane can be any transparency medium (e.g., photomask) or reflective medium (e.g., paper). The imaging system can contain mirrors, prisms, lenses, Fresnel lenses, beamsplitter, optical fiber, holographic elements, or a plurality of optical components. The working plane can be any recording medium (e.g., photographic film or a wafer coated with photoresist). This photolithography method provides a large field-of-view, high resolution and very high data rate and it can use visible, UV, IR, soft x-ray, or x-ray wavelength bands. In addition, an autofocus system can be incorporated into the imaging system to compensate for variations in the flatness of the pattern plane and working plane.

Figure 2:
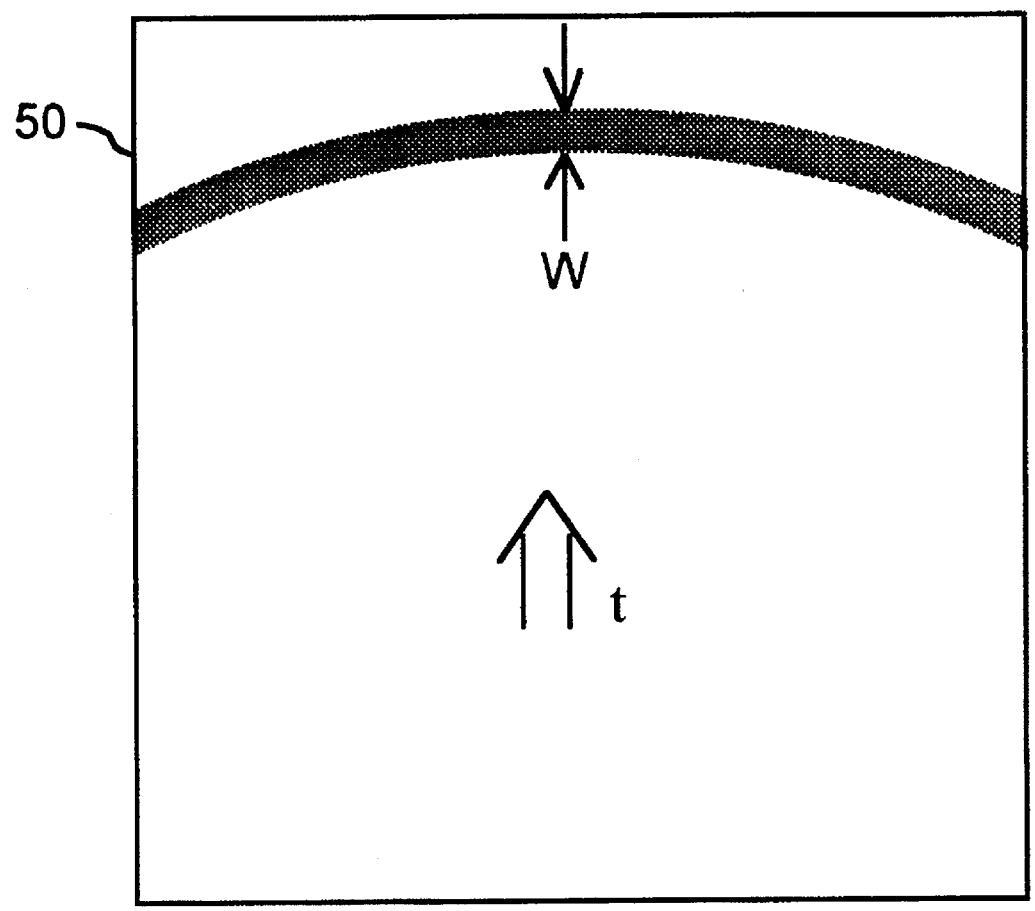
FIG. 2 shows a circular arc shaped region imaged onto the working plane by the rotating imaging system.

FIG. 2 illustrates the circular arc shaped region imaged from the pattern plane onto working plane 50 by a single pass of the rotating optical system. The translation direction of the working plane is indicated by the arrow t. The width of the circular arc, W, is related to the size of the image patch B indicated in FIG. 1. The translation velocity, t, must be such that adjacent image scans overlap to produce a complete reproduction of the pattern plane.

Figure 3A:
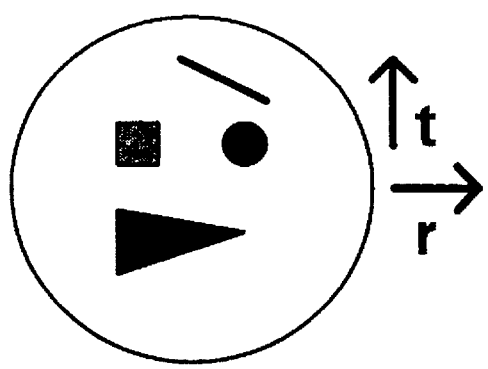
FIG. 3A is the subregion read from the pattern plane.
Figure 3B:
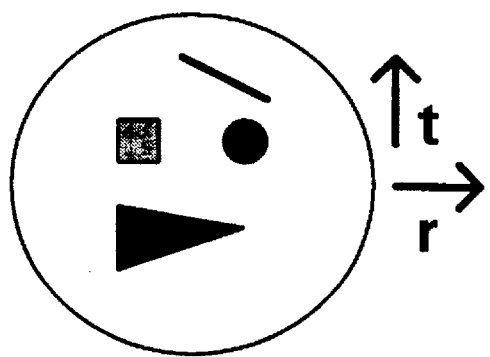
FIG. 3B is correctly oriented in the working plane.
Figure 3C:
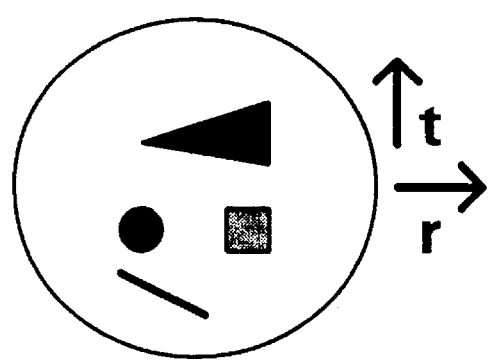
FIG. 3C is correctly oriented in the working plane.

The scan motion relative to the image orientation must be preserved for the photolithography method to work. If this relative orientation is not preserved, the scanning motion smears the image. FIG. 3A shows a subregion in the pattern plane where the relative motion from rotation and translation are indicated by arrows r and t, respectively. FIG. 3B shows a correctly oriented image in the working plane with respect to the scanning motion. This would produce a high resolution image. FIG. 3C shows an image in the working plane that is reflected with respect to the scanning motion. This would produce a severely smeared image.

Arbitrary magnification is possible with this new photolithography method. This requires that the imaging system have the desired magnification. Also, the distance of the imaging system's entrance pupil and exit pupil from the rotation axis should be scaled accordingly. In addition, the translation speed of the pattern plane and working plane must be scaled accordingly. For example, if a 2:1 reduction is desired, the magnification of the optical system should be 2:1, the ratio of the radius of the entrance pupil and exit pupil should be 2:1, and the relative translation speed of the pattern plane and working plane should be 2:1.

Figure 4:
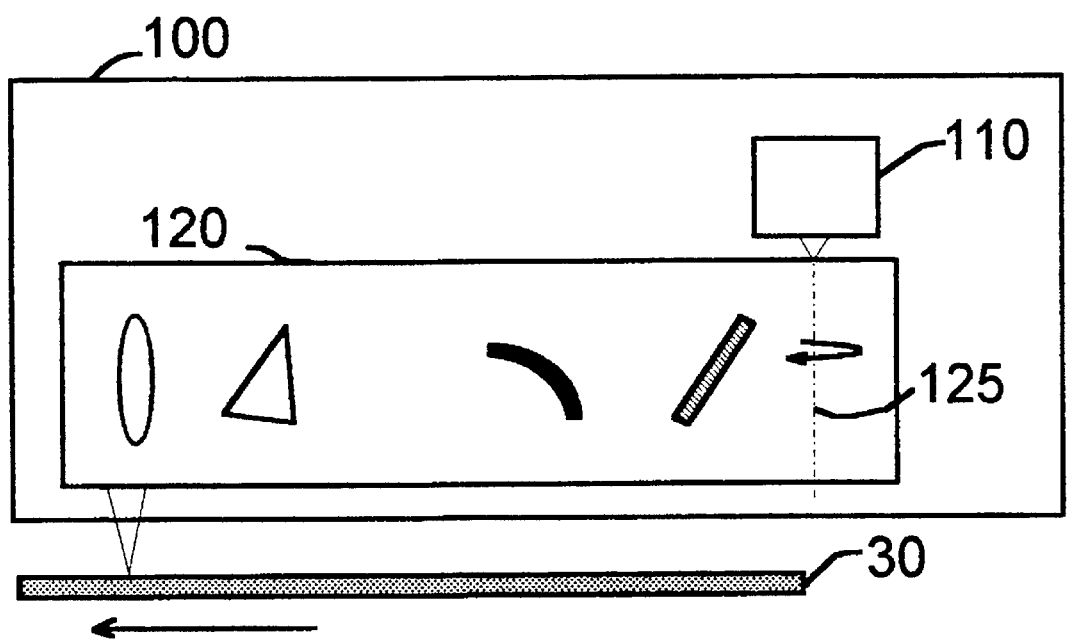
FIG. 4 shows a block diagram of an illumination system that could be used with the subject invention.

To avoid optical aberrations at the periphery of the optical imaging system, it is necessary to restrict the field-of-view of the imaging system. This can be accomplished by attaching baffles to the rotating optical system and/or by restricting the illumination area of the pattern plane. Restricted illumination of the pattern plane can be achieved by focusing light from a source into the central field-of-view of the rotating imaging system. In order to maintain the relative position of the illumination with respect to the rotating imaging system the illumination system must also include a rotating optical system. As the imaging system rotates, the illumination system rotates to stay centered in the field-of-view of the imaging system. FIG. 4 shows a possible illumination system. The light source 110 is imaged onto pattern plane 30 by a rotating optical system 120. The light from 110 enters 120 along the rotation axis. The rotation axis of optical system 120 is identical with the rotation axis of imaging system 40. The rotation of 40 and 120 are synchronized so the illumination always falls in the central field-of-view of imaging system 40. This illumination system offers advantage over disperse illumination because the light energy is effectively utilized. This is an important consideration in real systems where the throughput of a photolithography system can be limited by the exposure time.

Figure 5:
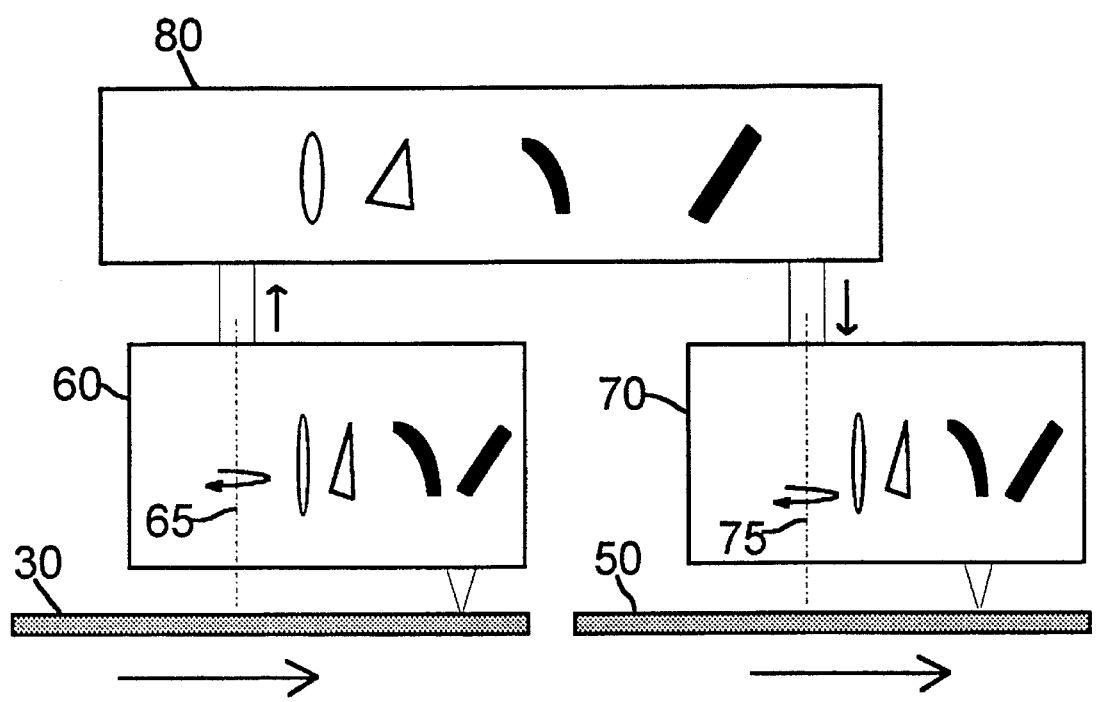
FIG. 5 shows a block diagram of a second realization of the proposed photolithography method where the imaging operation is performed by two rotating optical system and a stationary optical system.

FIG. 5 illustrates an alternate realization of our photolithography method. In this system, the imaging system is divided into 3 parts: a read system 60, a write system 70, and a relay system 80. Information from a subregion on pattern plane 30 is read by read system 60. Rotation of 60 allows information along a circular arc of pattern plane 30 to be read. The optical image information collected by 60 is transferred to its rotation axis 65 where it exits parallel to the rotation axis. Write system 70 receives optical image information along its rotational axis 75 transfers it outward and forms an image on working plane 50. The relay system 80 transfers information from 60 to 70. The three optical systems act together to image a subregion in pattern plane 30 onto a subregion in working plane 50. Synchronized rotation of 60 and 70 allow a circular arc shaped region in pattern plane 30 to be copied onto a circular arc shaped region in working plane 50. The entire pattern plane is copied by translating 30 and 50 while 60 and 70 are synchronously rotated.

DESCRIPTION OF PREFERRED EMBODIMENTS

Figure 6:
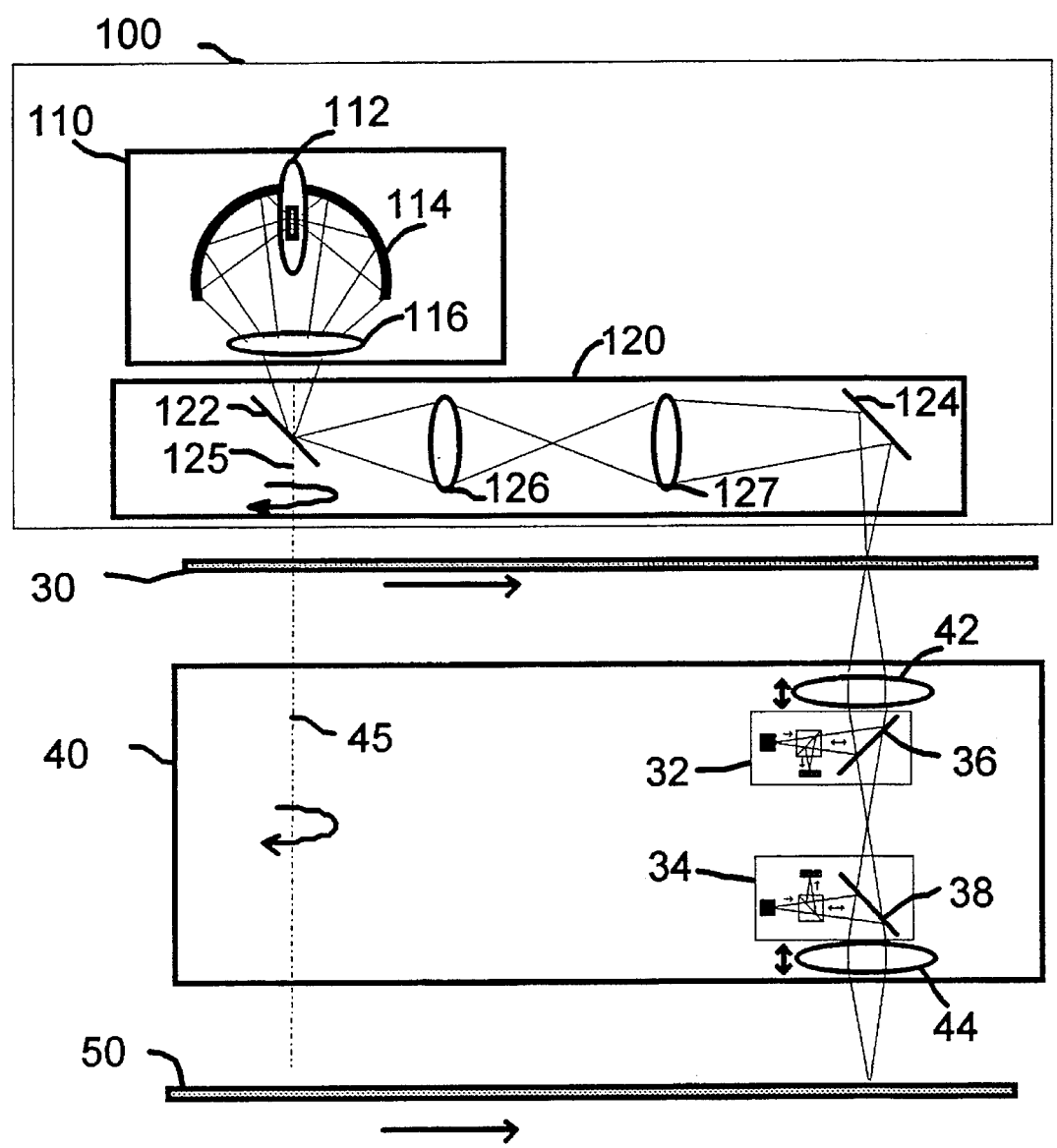
FIG. 6 shows a photolithography system where the imaging system consists of two lenses. The system also includes an illumination system and an autofocus system.

FIG. 6 shows an embodiment of our photolithography method. The rotating imaging system 40 consists of two lenses 42 and 44 of equal focal length separated by a distance of four focal lengths. Lens 42 is at a distance of two focal lengths from pattern plane 30 and Lens 44 is at a distance of two focal lengths from working plane 50. The lens combination images pattern plane 30 onto working plane 50 with unit magnification. In addition, the image is not reflected so that the image orientation and the rotational scan motion are consistent. Pattern plane 30 and working plane 50 are each translated in the same direction at the same speed. Pattern plane 30 is illuminated by the illumination system 100. The light source 110 is composed of: arc lamp 112, an ellipsoidal reflector 114, and lens 116. The rotating optical system 120 contains mirrors 122 and 124 and lenses 126 and 127. The rotation axis of imaging system 40 and optical system 120 are coincident and the rotation is synchronized so that the central field-of-view of image system 40 is always illuminated. The entire image is copied from 30 to 50 by rotating 40 and 120 while translating 30 and 50.

Also indicated in FIG. 6 are two autofocus systems 32 and 34, for lens 42 and lens 44, respectively. The autofocus system is similar to that used in the commercial compact disk players. Each autofocus system contains a diode laser which is used to measure the focus of the lens and provide feed back to a coil based translation system which controls the motion of the lens. Light from the diode lasers are place in the optical paths of the lenses by dichroic beamsplitters 36 and 38 which are transparent at photolithography wavelengths but reflective at diode laser wavelengths. This is one example of an autofocus system that could be used with our photolithography method. Many different autofocus systems exist which could also be used in our photolithography method.

Figure 7:
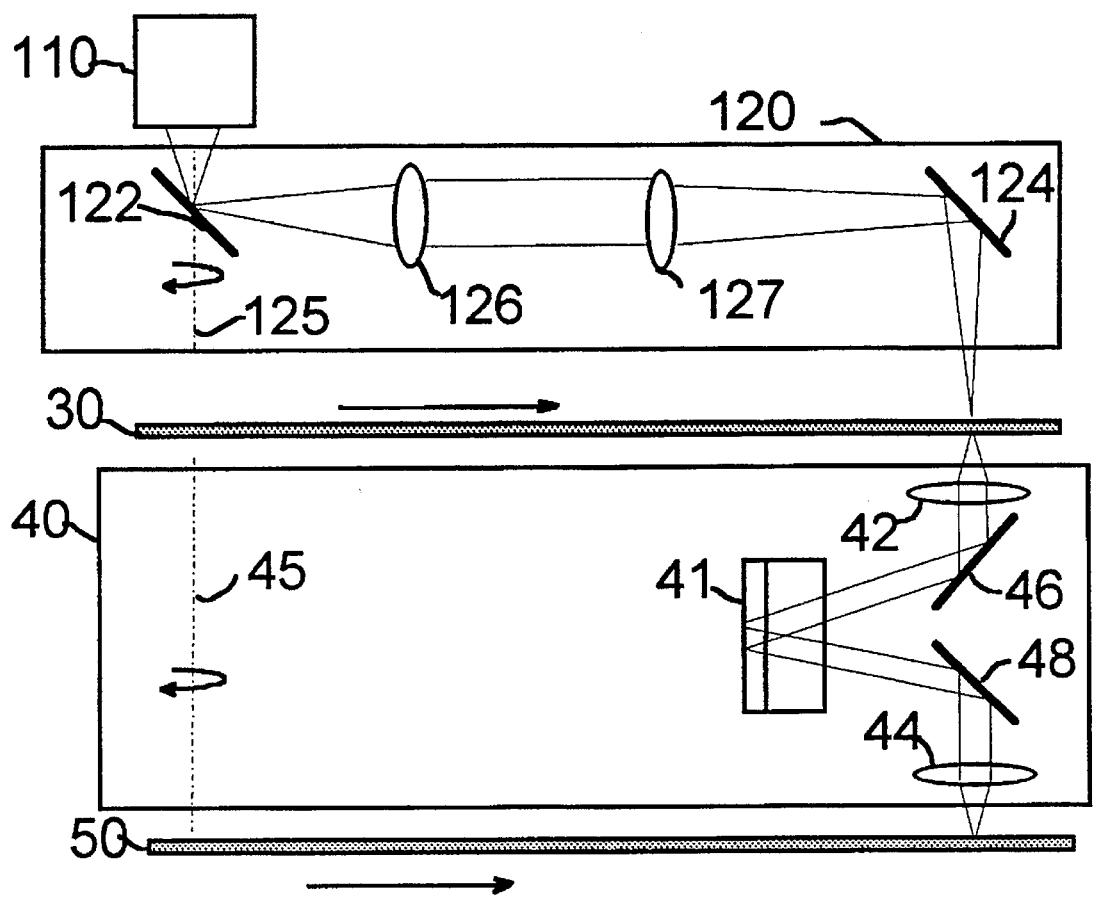
FIG. 7 shows a photolithography system where the optical imaging system is consists of two lenses and a roof prism.

Another embodiment of our photolithography method is given in FIG. 7 where the only difference with the previous embodiment is the imaging system 40. The rotating imaging system 40 consists of lenses 42 and 44, mirrors 46 and 48, and roof prism 41. Lens 42 is located a focal length away from pattern plane 30 and lens 44 is located a focal length from working plane 50. The function of the mirrors and roof prism are to reflect the image so that it is oriented in a manner consistent with the scanning motion. The entire image is copied from 30 to 50 by rotating 40 and 120 while translating 30 and 50. An autofocus system is not shown in FIG. 7; however, a variety of existing autofocus system could easily be incorporated into this system.

The photolithography system given in FIG. 7 can be used to produce active matrix liquid crystal displays. The light source could be a standard Xenon Mercury lamp which provides wavelengths from 0.2 µm to 0.4 µm. A standard, low cost lens with a numerical aperture (NA) of NA=0.1 can provide a resolution of 2.0 µm, a depth of focus of 20 µm and a field-of-view of 5 mm. If the lens images a 5 mm subregion and the optical system rotates at 100 RPM, the translation velocity of the pattern plane and working plane can be 500 mm per minute. If the distance of the imaging system from the rotation axis is 0.4 meters, the diameter of the circular scanned region is 0.8 meters. This can easily accommodate a 0.5 meter wide working plane. Such a system could expose a 500 mm×500 mm substrate with 2.0 µm resolution in one minute. Furthermore, the system can account for variations in the flatness of the pattern and work planes by employing an autofocus system.

Figure 8:
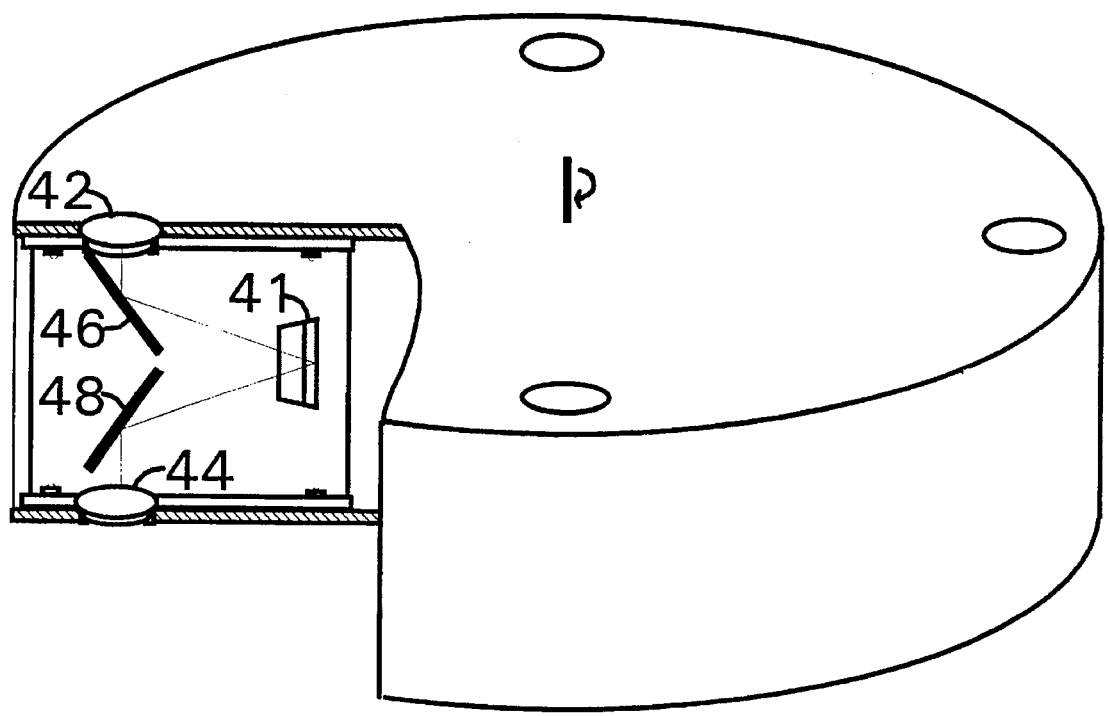
FIG. 8 shows a photolithography system where multiple optical imaging systems are placed around the rotational axis.

FIG. 8 shows another embodiment of our photolithography method. This optical imaging system is similar to that shown in FIG. 7; however, four different optical imaging systems are positioned at 90° intervals around the rotational axis. This enables four circular scans for each revolution of the optical system and increases the throughput of the photolithography system by a factor of four.

Figure 9A:
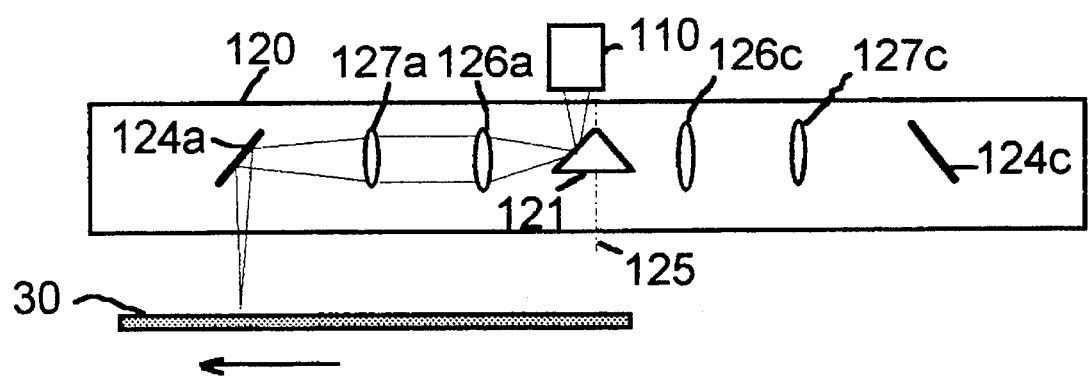
FIG. 9A shows a side view of an illumination system that could be used with the photolithography system shown in FIG. 8.
Figure 9B:
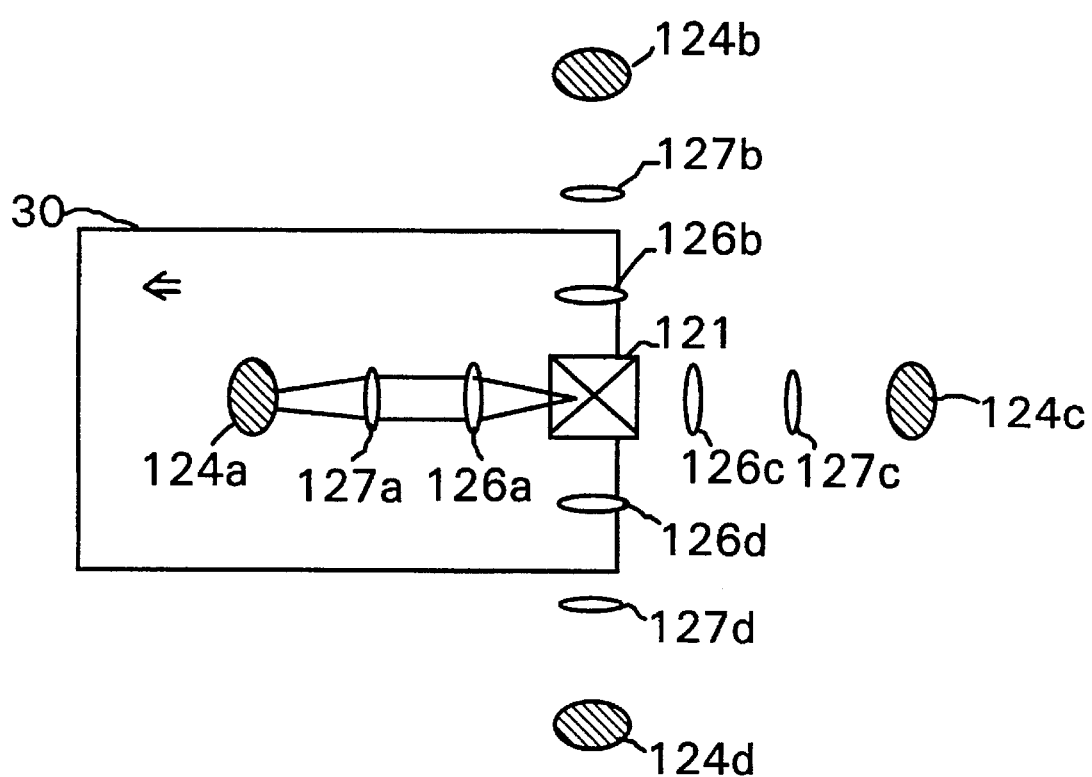
FIG. 9B shows a top view of a rotating optical system used in the illumination system shown in FIG. 9A.

FIG. 9A shows a side view of a possible illumination system for the system shown in FIG. 8. FIG. 9B shows a top view of the rotating optical system. The rotating optical system 120 has four arms where the elements in each arm are labeled by a number and a post-fixed letter (i.e., a, b, c, or d) depending upon which arm the element lies. Light from source 110 enters the rotating optical system 120 slightly displaced from the optical axis. It is reflected from a 4 sided, pyramid shaped mirror 121 where the normal to each mirror makes a 45 degree angle with the rotation axis. As a result, the light beam is always reflected into the sector that lies directly above pattern plane 30. Depending upon which face of mirror 121 the light is incident, it is reflected into one of the four arms. As illustrated in FIG. 9B the two lenses 126a and 127a refocus the light and mirror 124a deflects the converging light down onto pattern plane 30.

Figure 10:
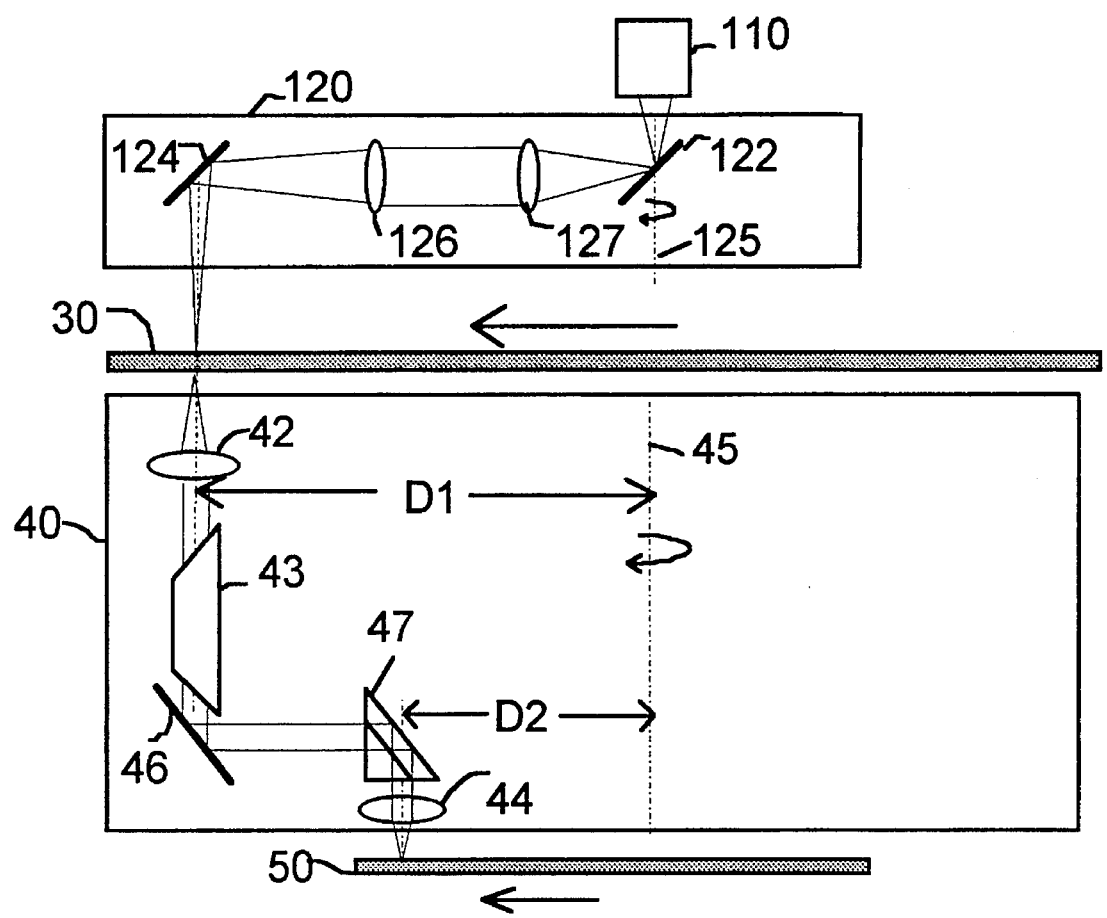
FIG. 10 shows a photolithography system which produces a 2-to-1 magnification. The imaging system is consists of two lenses of different focal length, a dove prim, and an Amici roof prism.

FIG. 10 shows another embodiment of our photolithography method. The rotating optical system 40 consists of: two lenses 42 and 44, mirror 46, Amici roof prism 47, and Dove prism 43. The system images pattern plane 30 onto working plane 50 with a 2-to-1 reduction. The distance D1 of lens 42 from rotation axis 45 is twice the distance D2 of lens 44 from the rotation axis. Lens 42 is located one focal length from pattern plane 30 and lens 44 is located one focal length from working plane 50; however, the focal length of 42 is twice the focal length of 44. The translation speed of pattern plane 30 is twice the translation speed of working plane 50. The entire image is copied from the pattern plane to the working plane by rotating the optical system while simultaneously translating the pattern plane and working plane.

Figure 11:
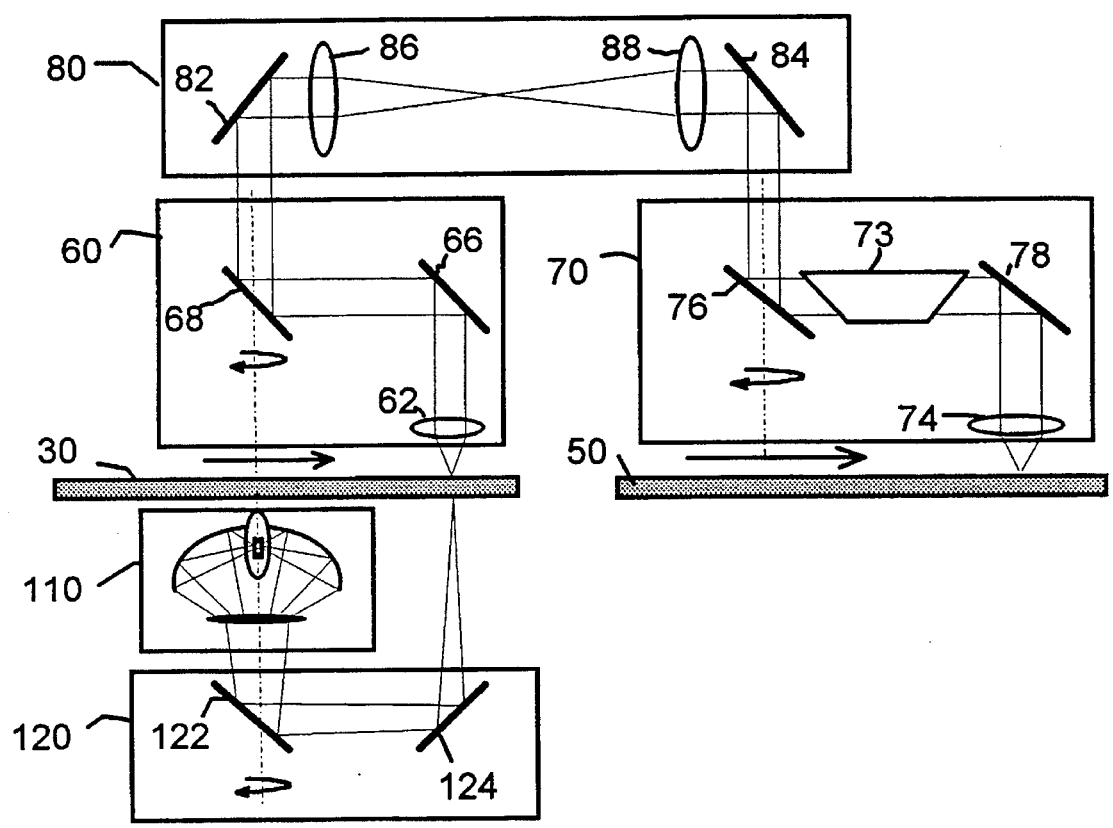
FIG. 11 shows a photolithography system where the imaging operation is performed by two rotating optical system and a fixed relay system.

FIG. 11 shows another embodiment of the photolithography system. In this embodiment the imaging system consists of two rotating optical systems, 60 and 70, and relay system 80. Optical read system 60 consist of lens 62 one focal length from working plane 30 and two mirrors 66 and 68 which deflect the light so it exits the system along the rotation axis. Optical relay system 80 consists of two mirrors 82 and 84 and two lenses 86 and 88. Optical write system 70 consists of lens 74 one focal length away from working plane 50, two mirrors 76 and 78 a dove prism 73. Optical system 60 reads information from pattern plane 30 and optical system 70 writes information to working plane 50. Optical system 80 relays information from optical system 60 to optical system 70. Synchronized rotation of 60 and 70 permit a circular shaped region to be imaged from pattern plane 30 to working plane 50. Here unit magnification is assumed but any magnification would be possible. Unit magnification implies that pattern plane 30 and working plane 50 are translated at the same velocity so that 30 and 50 can be attached to a single structural translation unit. Synchronized rotation of 60 and 70 along with synchronized translation of 30 and 50 allows 30 to be copied onto 50.

Figure 12:
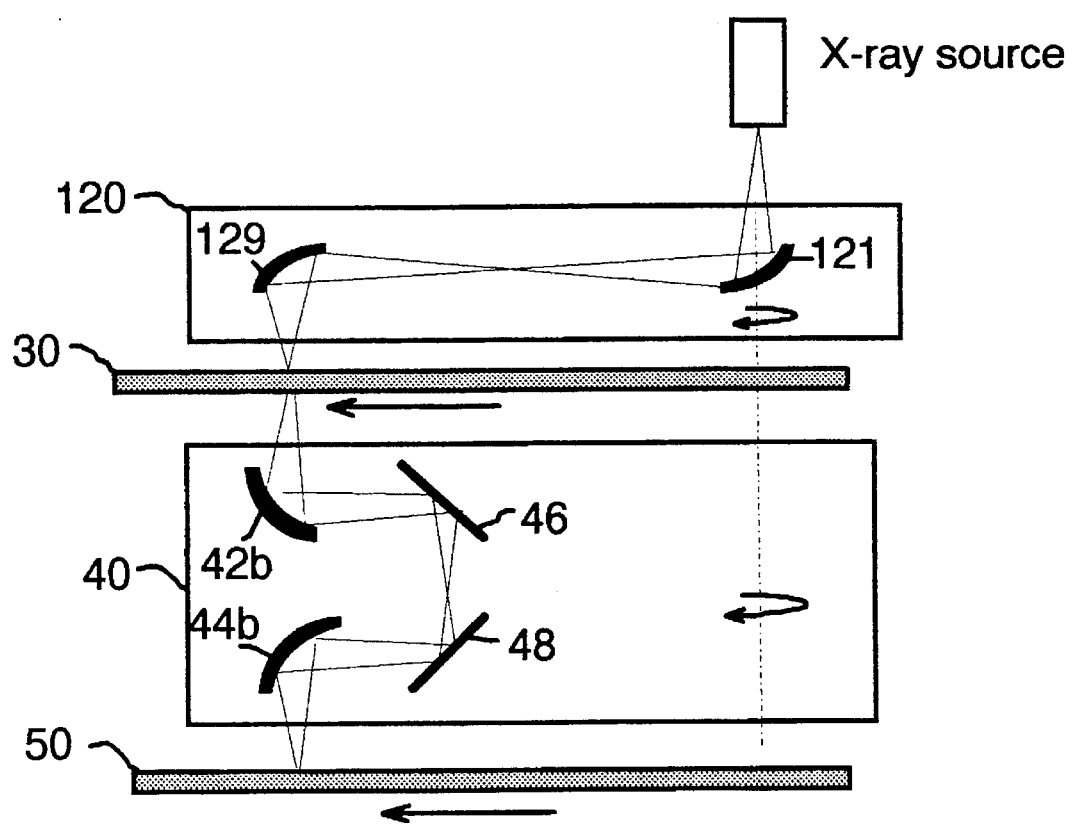
FIG. 12 shows a photolithography system which uses x-ray illumination. The imaging system is realized with two ellipsoidal mirrors and two planar mirrors.

FIG. 12 shows another embodiment of our photolithography method. The rotating optical system 40 consists of: two ellipsoidal mirrors 42b and 44b, and two planar mirrors 46 and 48. The first focus point of ellipsoidal mirror 42b is located at pattern plane 30, and the second focus point of ellipsoidal mirror 44b is located at working plane 50. A subregion in pattern plane 30 is imaged by ellipsoidal mirror 42b from its first focus point to its second focus point. The second focus point of ellipsoidal mirror 42b is located at the first focus point of ellipsoidal mirror 44b.

The ellipsoidal mirror 44b images the subregion image from its first focus point to its second focus point, which lies in working plane 50. The light source 110 is composed of a x-ray source and focus mechanism. The rotating optical assemble 120 contains two ellipsoidal mirrors 121 and 129. The rotation axis of imaging system 40 and optical system 120 are coincident and the rotation is synchronized so that the central field-of-view of the image system is always illuminated. The entire image is copied from the pattern plane to the working plane by rotating the imaging system while translating the pattern plane and working plane.

SUMMARY, RAMIFICATIONS, AND SCOPE

Accordingly, the reader will see that the photolithography method described by this invention can find many applications in various areas, such as high quality photographic reproductions, graphic-arts, the manufacturing of integrated circuits, the manufacturing of flat panel displays (e.g., active matrix liquid crystal displays), etc. In addition, the photolithography method described in this invention can provide many features which cannot be accomplished with other methods. Furthermore, the proposed photolithography method has the additional advantages in that:

it can provide large field-of-view and high resolution at the same time;

it can achieve very high exposure rates with only modest rotation speed of the imaging system;

it can incorporate an autofocus system to compensate for variation in the surface flatness of the pattern plane and working plane;

it can use extra-ultraviolet and x-ray imaging systems to provide resolutions of better than 0.3 µm while scanning a large area;

For instance, it can provide a large field-of-view, high resolution photolithography system for producing flat panel displays with an exposure rate in excess of 1 square meter per minute at a resolution of 2 µm.

Although the description above contains many specificities, these should not be construed as limiting the scope of the invention but merely providing illustrations of some of the presently preferred embodiments of this invention. For example, different kinds of optical components can be used to achieve the imaging operation; different methods such as optical baffles can be used to control the field of view of the optical imaging system; different types of autofocus systems can be employed; etc.

Thus the scope of the invention should be determined by the appended claims and their legal equivalents, rather than by the examples given.

We claim:

1. A photolithography device comprising:

an illumination system comprising a light emitting source and a rotating projection unit including lenses and reflectors, whereby light from said emitting source is focused and projected to a pattern plane fed in a predetermined direction;

a rotating imaging system for imaging the illuminated spot of said pattern plane onto a planar recording medium approximately parallel to said pattern plane and fed in a predetermined direction;

whereby the photolithography is completed when each part of said pattern is progressively projected onto said recording medium with the rotation of said projection unit and said imaging system, wherein the scanning traces are circular arcs across the width of said recording medium.

2. The device as defined in claim 1, wherein said pattern plane is a transparent photomask.

3. The device as defined in claim 1, wherein said pattern plane is a reflective medium such as paper.

4. The device as defined in claim 1, further including a focusing means for automatically adjusting the focus of the scanning image spot on said planar recording medium.

5. The device as defined in claim 1, wherein said projection unit rotates around an axis substantially coincident with the rotational axis of said imaging system, with the rotation being synchronized and the projected image of said pattern being centered in the field-of-view of said imaging system.

6. The device as defined in claim 1, comprising a plurality of said rotating projection units and a plurality of said rotating imaging systems, wherein said projection units and said imaging systems are approximately uniformly distributed around their rotational axis.

7. The device as defined in claim 1, wherein the rotation axis of said projection unit and the rotation axis of said imaging system are substantially perpendicular to said pattern plane.

8. A photolithography device comprising:

a pattern plane fed in a predetermined direction;

an illumination source illuminating said pattern plane;

a planar recording medium fed in a predetermined direction; a rotating imaging read system comprising means for collecting image information from said pattern plane and sending out said image information along the rotational axis of said imaging read system, whereby said imaging read system scans a circular arc shaped region of said pattern plane;

a rotating imaging write system comprising means for receiving said image information along the rotational axis of said imaging write system and projecting said image information onto said planar recording medium, wherein rotation of said imaging write system is synchronized, whereby said circular arc shaped region from said pattern plane is imaged onto said planar recording medium;

an imaging relay system for relaying said image information from said imaging read system to said imaging write system.

9. The device as defined in claim 8, wherein the rotational axis of said imaging read system is substantially perpendicular to said pattern plane and the rotational axis of said imaging write system is substantially perpendicular to said planar recording medium.

10. The device as defined in claim 8, wherein said pattern plane is a transparent photomask.

11. The device as defined in claim 8, wherein said pattern plane is a reflective medium such as paper.

12. The device as defined in claim 8, wherein said imaging write system further includes a focusing means for automatically adjusting the focus of the scanning image spot on said planar recording medium.

13. The device as defined in claim 8, wherein said imaging read system further includes a focusing means for automatically focusing said imaging read system on said pattern plane.

14. The device as defined in claim 8, wherein said imaging read system and said imaging write system further include focusing means for automatically focusing the scanning image spot on said planar recording medium.

15. The device as defined in claim 8, wherein said illumination source includes:

a radiation source;

a rotating illumination system, comprising means for focusing said radiation source onto a small region of said pattern plane, wherein said rotating illuminatino system rotates around an axis substantially coincident the rotation axis of said imaging read system, with the rotation being synchronized with the rotation of said imaging read system, whereby the illuminated region of said pattern plane is substantially centered in the field-of-view of said imaging read system.

16. The device as defined in claim 8, including a plurality of rotating imaging read systems and a plurality of said rotating imaging write systems, wherein said imaging read system and said imaging write systems are approximately uniformly distributed around their rotational axis.

17. The device as defined in claim 16, wherein said illumination source includes:

a radiation source;

a plurality of rotating illumination systems, comprising means for focusing said radiation source onto a small region of said pattern plane, wherein only one said illumination system receives light from said radiation source at one time forming the image of illuminated region approximately in the center of the field-of-view of said imaging read system and wherein said rotating illumination systems rotate around an axis substantially coincident the rotation axis of said imaging read system, with the rotation being synchronized with the rotation of said imaging read system.

* * * * *